(12) United States Patent
Kwon et al.

(10) Patent No.: US 12,382,594 B2
(45) Date of Patent: Aug. 5, 2025

(54) DISPLAY DEVICE

(71) Applicant: LG DISPLAY CO., LTD., Seoul (KR)

(72) Inventors: Suchan Kwon, Paju-si (KR); Buhui Lee, Paju-si (KR)

(73) Assignee: LG Display Co., Ltd. (KR)

( * ) Notice: Subject to any disclaimer, the term of this patent is extended or adjusted under 35 U.S.C. 154(b) by 333 days.

(21) Appl. No.: 17/990,771

(22) Filed: Nov. 21, 2022

(65) Prior Publication Data

US 2023/0171905 A1 Jun. 1, 2023

(30) Foreign Application Priority Data

Dec. 1, 2021 (KR) .................. 10-2021-0169938

(51) Int. Cl.
*H05K 5/02* (2006.01)
(52) U.S. Cl.
CPC .................. *H05K 5/0217* (2013.01)
(58) Field of Classification Search
CPC .................. H05K 5/0017; H05K 5/0217

USPC .................. 361/807, 809, 810
See application file for complete search history.

(56) References Cited

U.S. PATENT DOCUMENTS

| | | | |
|---|---|---|---|
| 2014/0217328 A1* | 8/2014 | Daly | B01J 35/77 252/373 |
| 2019/0174658 A1* | 6/2019 | Qi | H04M 1/0268 |
| 2019/0207130 A1* | 7/2019 | He | H10K 71/80 |
| 2020/0264668 A1* | 8/2020 | Baek | H05K 1/118 |
| 2022/0181576 A1* | 6/2022 | Cha | H10K 50/87 |
| 2022/0209167 A1* | 6/2022 | Park | B32B 5/18 |

FOREIGN PATENT DOCUMENTS

| | | | | |
|---|---|---|---|---|
| KR | 102037694 B1 | * | 10/2019 | G09F 9/00 |
| KR | 20220080862 A | * | 6/2022 | H01L 51/52 |
| KR | 20220095664 A | * | 7/2022 | H05K 51/14 |

\* cited by examiner

*Primary Examiner* — Hung S. Bui
(74) *Attorney, Agent, or Firm* — Fish & Richardson P.C.

(57) ABSTRACT

A display device capable of implementing a narrow bezel by forming a radius of curvature of a bending part to be smaller and reinforcing rigidity of a display panel by disposing reinforcing members in the bending part.

14 Claims, 11 Drawing Sheets

DISPLAY DEVICE

CROSS-REFERENCE TO RELATED APPLICATION

The present application claims the priority of Korea Patent Application No. 10-2021-0169938, filed on Dec. 1, 2021, which is hereby incorporated by reference in its entirety.

BACKGROUND

Field of the Disclosure

The present disclosure relates to a display device, and more particularly to a display device capable of implementing a narrow bezel by reducing a non-active area of a display device and reinforcing rigidity of a bending part.

Description of the Background

Display devices that display images in televisions, monitors, smartphones, tablet PCs, laptops and the like utilize various methods and take various shapes.

Among the display devices utilizing various methods, Liquid Crystal Display Device (LCD) has been used up until now, and the scope of use and application of Organic Light Emitting Display Device (OLED) is rapidly expanding.

Since a display device includes a display panel having a plurality of light-emitting elements or liquid crystals to implement images, and a driving transistor to control operation of each light-emitting element or liquid crystal, the display device employs a plurality of light-emitting elements or liquid crystals to display images as intended.

Among such devices, the liquid crystal display device does not implement a self-light emitting method, and thus the liquid crystal display device requires a light source such as a backlight that emits light from a rear surface. The backlight increases a thickness of the liquid crystal display device, and causes restrictions in implementing a device to take various types of designs such as a bendable design.

Since an organic light emitting display device having self-light emitting elements can be made thinner than the display device equipped with a light source inside and does not require a separate light source, the organic light emitting display device can be implemented to take various designs such as a bendable design.

The organic light emitting display device includes a flexible display panel. The flexible display panel may include an active area displaying images, a non-active area surrounding the active area and a bending part which extends from the non-active area and is bendable. At one side of the bending part, a pad part may be disposed in order to electrically connect additional components such as a flexible printed circuit board or a driver to drive pixels.

A bending part refers to a part that extends from a side of a front part in which images are displayed and is bent downwards, and the thicker a thickness of a display device gets, the larger a radius of curvature gets, leading to increase a non-active area. If the non-active area is increased, a size of the overall product including the display device gets bigger, portability gets degraded and such thickness becomes a shortcoming in the design. In addition, there may be a problem that the attention of a user may not focus on the active area and be turned to the non-active area.

If decreasing the radius of curvature to reduce the non-active area, compressive force and tensile force given to the bending part increases, and the display panel may get a crack or be broken.

In addition, the bending part may be vulnerable to external shocks because the bending part is positioned at the outermost part of the display device. If such external shocks are given to the bending part, the bending part may be deformed and have a crack or be broken.

The above information disclosed in this Background section is only for enhancement of understanding of the background of the described technology and therefore it may contain information that does not form prior art that is already known to a person of ordinary skill in the art.

SUMMARY

Accordingly, the present disclosure is to provide a display device having a reduced non-active area by forming a smaller radius of curvature of the bending part.

The present disclosure is also to provide additional reinforcing structures to prevent the bending part having a smaller radius of curvature from being easily deformed so that a crack or breakage can be prevented.

The present disclosure is to provide a display device having improved rigidity of the bending part by reducing the non-active area.

The present disclosure is not limited to what are mentioned hereinabove, and other effects not mentioned can be clearly understood by those skilled in the art from the following description.

In an aspect of the present disclosure, a display device includes a display panel comprising a front part configured to display images, a bending part configured to extend from the front part and be bent and a pad part configured to extend from the bending part and be disposed below the front part; and a first plate, a cushion plate and a second plate configured to be disposed between the front part and the pad part.

In addition, the cushion plate includes a first adhesive layer, a cushion layer, and a heat dissipation layer; and a portion of the pad part is configured to contact with the first adhesive layer and another portion of the pad part is configured to be disposed below the second plate, thereby forming a radius of curvature of the bending part to be smaller and reducing a non-active area of the display device.

In another aspect of the present disclosure, a display device includes a display panel comprising a front part configured to display images, a bending part configured to extend from the front part and be bent and a pad part configured to extend from the bending part and be disposed below the front part; and a first plate, a cushion plate and a second plate configured to be disposed between the front part and the pad part.

Further, the cushion plate includes a first adhesive layer, a cushion layer and a heat dissipation layer; and the first adhesive layer may be formed to protrude further towards a bending part area where the bending part is positioned or towards a side of the bending part than the cushion layer, the heat dissipation layer and the second plate. Thus, a distance between the pad part and the front part becomes shorter towards a side of the bending part, and accordingly a radius of curvature of the bending part gets smaller, resulting in reduction in the non-active area of a display device.

In addition, a first reinforcing member is further configured to be disposed on an outer surface of the bending part; and a second reinforcing member is further configured to be disposed on an inner surface of the bending part, thereby preventing a crack or breakage that may occur in the bending part.

In a further aspect of the present disclosure, a display device includes a display panel comprising a front part configured to display images, a bending part configured to extend from the front part and be bent and a pad part configured to extend from the bending part and be disposed below the front part; and a first adhesive layer, a porous substrate and a second plate configured to be disposed between the front part and the pad part.

The first adhesive layer protrudes further towards a bending part area or a side of the bending part than the second plate; and the porous substrate comprises a stepped portion of which a second area configured to be disposed on an upper portion of the pad part and a first area configured to protrude further towards a bending part area or a side of the bending part, and thus, the non-active area of the display device can be reduced.

Other details of aspects are included in the detailed description and accompanying drawings.

According to aspects of the present disclosure, the non-active area of the display device can be reduced and thus, the overall size of the display device can be made smaller, resulting in improved portability and design of the display device.

Further, by additionally disposing reinforcing members in the bending part, cracks and breakage that may occur in the bending part can be prevented.

Advantageous Effects of the present disclosure are not limited to what are mentioned hereinabove, and other effects not mentioned can be clearly understood by those skilled in the art from the following description.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1A:
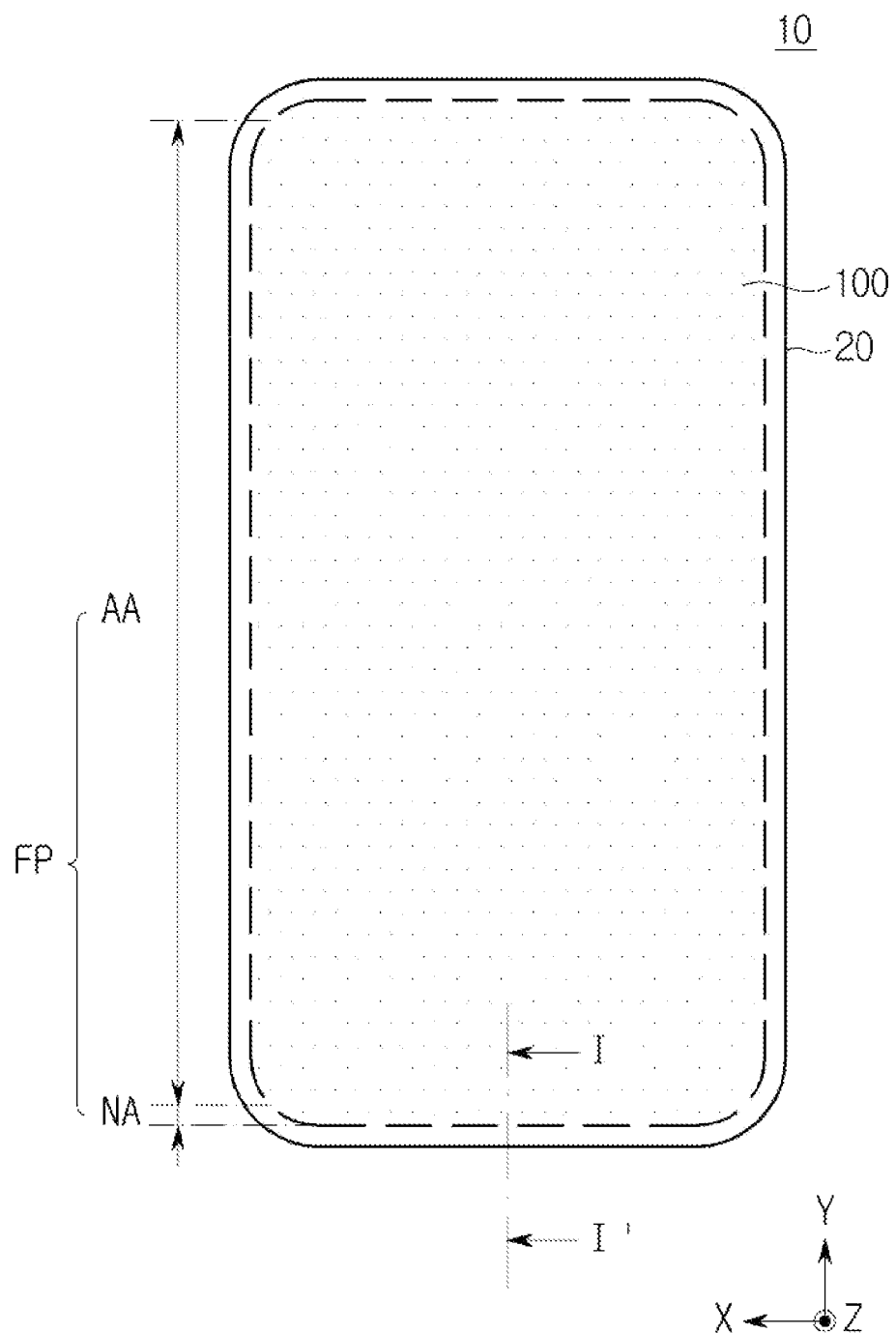
FIG. 1A is a plan view that shows a front surface of a display device according to an aspect of the present disclosure.

Details to demonstrate the present disclosure will be more clearly understood from the following detailed description with accompanying drawings. However, the present disclosure is not limited to the aspects disclosed hereinafter and can be implemented in various different forms. These aspects are provided so that the present disclosure can be thorough and complete, and can fully convey the scope of the present disclosure to a person skilled in the art, and the claims are not limited by aspects of the present disclosure.

It is to be understood that the present disclosure is not limited to accompanying drawings since shapes, sizes, ratio, angle, counts and the like are taken merely as examples to explain aspects. Like reference numerals denote like elements throughout the specification. In addition, in describing the present disclosure, if a description of a related known art in detail is deemed to unnecessarily obscure the substance of the present disclosure, description of such art will be omitted. When terms, 'comprise', 'have' and 'be achieved' and the like, are used in the present disclosure, other object not mentioned therein may be added unless the terms are used with the term 'only'. The singular forms expressed herein are intended to include the plural forms as well, unless the context expressly indicates otherwise.

Components are interpreted to include an error range unless otherwise expressly stated.

In case of describing positions, for example, when describing position relation between two parts with terms such as 'in', 'upon', 'below', 'next' and the like, one or more intervening parts may be disposed between the two parts, unless the terms are used with terms 'immediately' or 'directly'.

When an element or layer is disposed 'on' the other element or layer, another element or layer may be disposed directly on the other element or layer or therebetween.

Though terms such as 'a first', 'a second' are used to describe various components, these components are not confined by these terms. These terms are merely used to distinguish one component from the other component. Therefore, a first component being mentioned in the description below may be a second component in a technical concept of the present disclosure.

Like reference numerals denote like elements throughout the specification.

Sizes and thicknesses in the accompanying drawings are chosen for convenience of describing the specification; thus, the present disclosure is not limited by the illustrated sizes and thicknesses of the drawings.

The features of various aspects of the present disclosure can be partially or entirely connected or combined with each other and can be interlocked and operated in technically various ways as will be fully understood by those skilled in the art, and the aspects can be carried out independently of or in association with each other.

The display device of the present disclosure may be applied to an organic light emitting display device, but is not limited thereto, and may be applied to various display devices such as LED display device or Quantum Dot display device.

Hereinafter, a display device according to aspects of the present disclosure will be described in detail with reference to accompanying drawings.

Figure 1B:
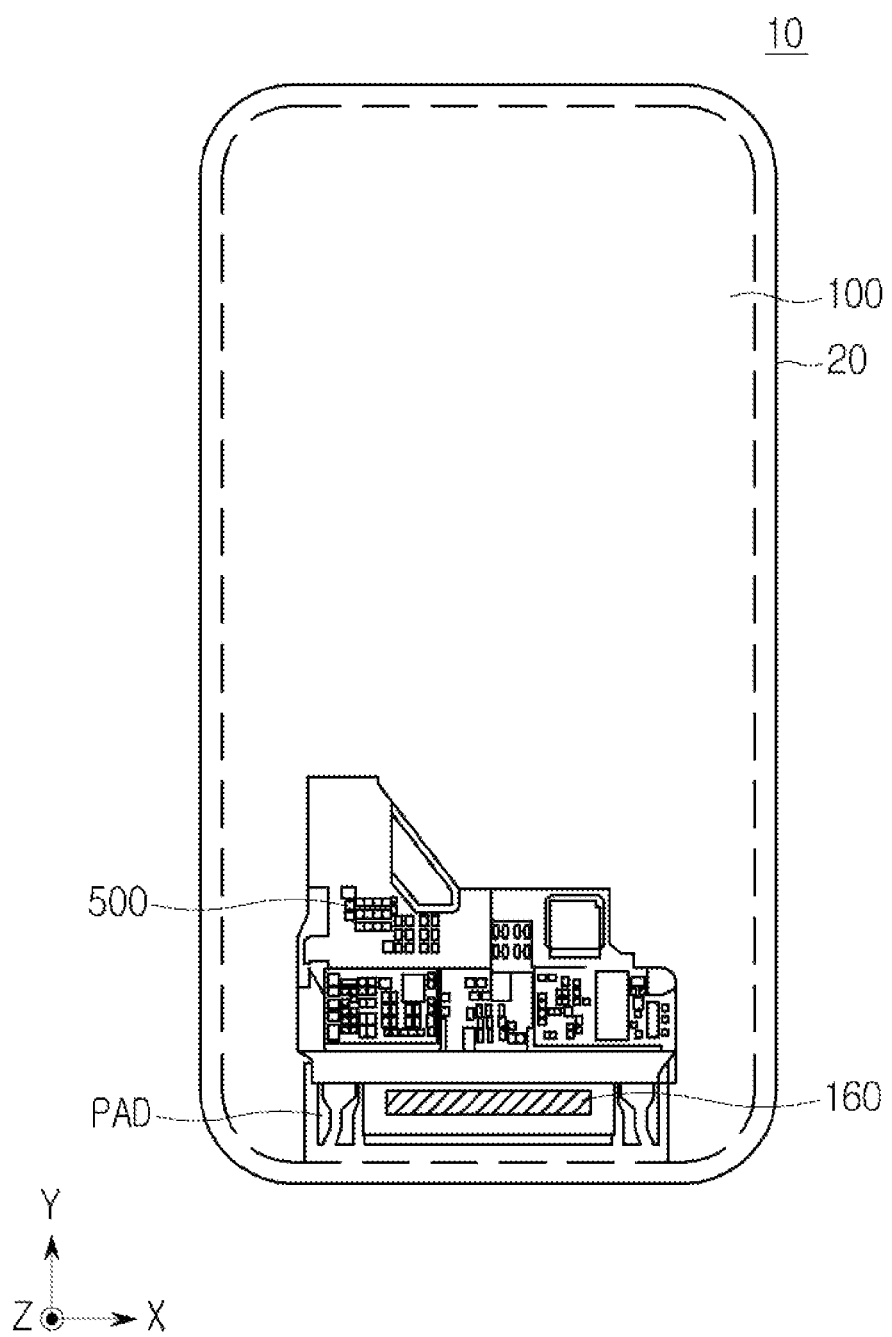
FIG. 1B is a plan view that shows a rear surface of a display device.

FIG. 1A is a plan view that shows a front surface of a display device and FIG. 1B is a plan view that shows a rear surface of a display device.

FIG. 1A shows a front surface in which an active area (AA) is positioned in a display device 10 and FIG. 1B shows a rear surface of a display panel 10 in which a driver 160 and a flexible printed circuit board 500 are mounted.

Referring to FIG. 1A and FIG. 1B, the display device 10 may include a cover member 20 and a display panel 100 attached below the cover member 20 (−Z axis). The display device 10 may include a first plate, a cushion plate, a connecting member and a second plate configured to be disposed below the front part of the display panel 100.

The cover member 20 is disposed to cover the front part of the display panel 100 so that it can protect the display panel 100 from external shocks. The cover member 20 may be formed of a cover glass, a tempered glass, a reinforced plastic and the like, and is not limited thereto.

Edges of the cover member 20 may have a curved surface or a curvature point configured to be curved in a rear direction (−Z direction) of the display device 10.

Since the cover member 20 may be disposed to cover side areas of the display device 10 positioned below the cover member 20, it can protect side areas of the display panel 100 as well as the front of the display device 10 from external shocks.

The cover member 20 may be formed of a transparent material so that it can overlap with an area displaying images. For example, the cover member 20 may be formed of a transparent plastic or a cover glass made of a transparent glass that may transmit images, but is not limited thereto.

Below the cover member 20, a front part (FP) of the display panel 100 may be disposed. In the front part (FP), a pixel array unit is disposed to display images and the pixel array unit includes a plurality of pixels having light emitting elements and a thin film transistor and a wiring of signals transmitting a driving signal. The front part (FP) may include an active area (AA) where images are displayed and a non-active area (NA) that is the outside of the active area (AA). The non-active area (NA) may be formed at edges encompassing the active area (AA). The non-active area (NA) may be an area that includes a bending part (BND) of the display panel 100. Moreover, the bending part (BND) of the display panel 100 is visible from a top surface direction (Z axis) of the display device 10, and since images are not displayed there, the bending part (BND) of the display panel 100 is referred to as the non-active area (NA) of the bending part (BND).

Division of the active area (AA) and the non-active area (NA) may be the same in the cover member 20. In the cover member 20, an area where images are transmitted may be the active area (AA) and an area that encompasses the active area (AA) and where images cannot be transmitted may be the non-active area (NA).

The display panel 100 disposed below the cover member 20 may include a bending part extends and is bent from a side of the front part.

Since the bending part is positioned at the outermost part of the display device 10, the bending part may be easily exposed to external shocks. Therefore, the bending part may be easily deformed and have a crack or be broken if such external shocks are given.

Figure 2:
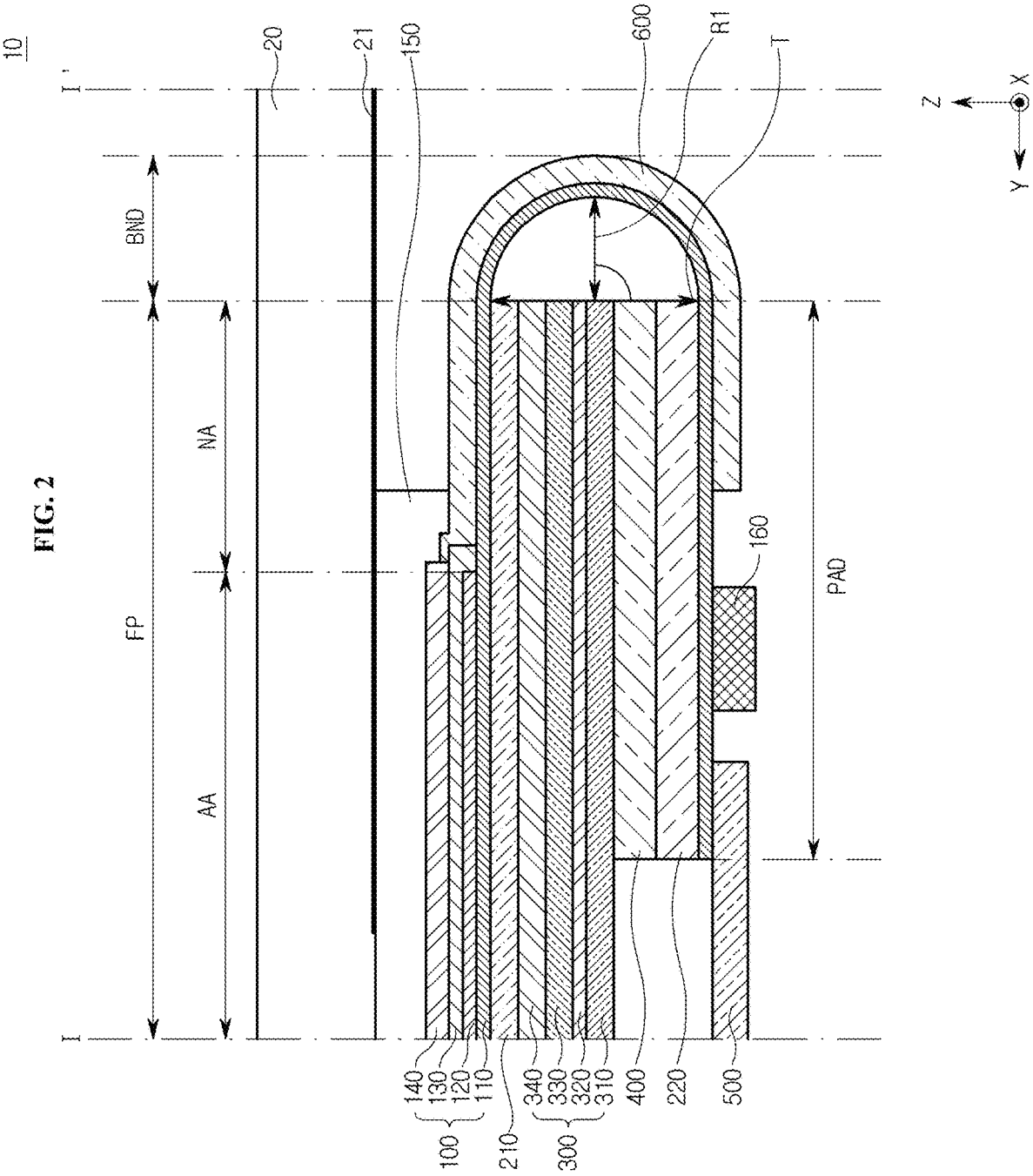
FIG. 2 is a cross-sectional view taken along line I-I' of FIG. 1A.

FIG. 2 is a cross-sectional view taken along line I-I' of FIG. 1A.

With reference to FIG. 2, the display device 10 may include a cover member 20 positioned at the top surface and a display panel 100 disposed below the cover member 20.

Between the cover member 20 and the display panel 100, a first connecting member 150 may be disposed. The first connecting member 150 may connect or couple the cover member 20 and the display panel 100.

Since the first connecting member 150 may overlap with the active area (AA), a material that can transmit images of the display panel 100 may be used. For example, the first connecting member 150 may be formed of Optical Clear Adhesive (OCA), Optical Clear Resin (OCR), or Pressure Sensitive Adhesive (PSA) and the like, or a material which may include one among the above material, but is not limited thereto.

A light blocking unit 21 may be disposed at edges that includes the non-active area (NA) below the cover member 20.

The light blocking unit 21 may prevent various circuits, wirings and structures disposed in the non-active area (NA) of the display panel 100 from being made visible to users.

The light blocking unit 21 may be disposed to correspond to at least the non-active area (NA) of the display panel 120. The light blocking unit 21 may be formed of a material capable of absorbing light. For example, the light blocking unit 21 may be formed of a black matrix, and may be formed in a method of printing a black ink, and is not limited thereto.

The display panel 100 disposed below the cover member 20 may include the front part (FP), the bending part (BND) and the pad part (PAD) based on a display substrate 110.

The front part (FP) of the display panel 100 may be disposed below the first connecting member 150. For example, the front part (FP) may be an area where images are displayed, and may include the display substrate 110, the pixel array unit 120, an encapsulation layer 130 and an optical plate 140.

The bending part (BND) of the display panel 100 may refer to a part that extends from a side of the front part (FP) and is bent in a downward direction (−Z direction), and then bent again in a plane direction (Y direction). In the bending part (BND), the display substrate 110 and the wiring of signals may be included.

The pad part (PAD) of the display panel 100 may extend from the bending part (BND) and be disposed below the front part (FP). The pad part (PAD) may include the display substrate 110, the wiring of signals, and a pad electrode connected to the wiring of signals. The flexible printed circuit board 500 or a driver 160 to drive pixels may be mounted in the pad electrode.

An optical plate 140 may be disposed upon the front part (FP). And between the first connecting member 150 and the optical plate 140, a functional layer may be further disposed to improve display performance of the display device 10.

The optical plate 140 may improve outdoor visibility and contrast ratio of images being displayed in the display panel 100 by preventing reflection of the external light.

At the bottom of the display panel 100, the display substrate 110 may be disposed. The front part (FP), the bending part (BND), and the pad part (PAD) may all have the display substrate 110. The display substrate 110 may be formed of a flexible plastic material and thus, it may have flexibility. The display substrate 110 may be formed by including polyimide, and may be formed of a thin flexible glass material.

In the display substrate 110, the pixel array unit 120 may be disposed. The pixel array unit 120 may display images. A part where the pixel array unit 120 is disposed may be the active area (AA). Therefore, based on the cover member 20, an area corresponding to the pixel array unit 120 may be the active area (AA) and the remaining area other than the active area (AA) may be the non-active area (NA).

The pixel array unit 120 may include the light emitting elements, the thin film transistor to drive the light emitting elements, data lines and gate lines disposed in the display substrate 110, and the wiring of signals such as a power line to drive pixels.

The pixel array unit 120 may include pixels displaying images according to signals supplied to the wiring of signals, and a pixel may include a light emitting element and a thin film transistor. The light emitting element may include an anode electrode electrically connected with the thin film transistor, an emitter layer formed in the anode electrode, and a cathode electrode supplying a common voltage.

The thin film transistor may include a gate electrode, a semiconductor layer, a source electrode, a drain electrode and the like. The semiconductor layer of the thin film transistor may include a silicone such as an a-Si, a poly-Si, a low temperature poly-Si and the like or an oxide such as Indium-Gallium-Zinc-Oxide (IGZO), but is not limited thereto.

The anode electrode may be disposed in each pixel area to correspond to an opening area arranged depending on a pattern form of a pixel and may be electrically connected with the thin film transistor.

The light emitting element may include an emitter layer formed between an anode electrode and a cathode electrode. The emitter layer may be implemented to emit light in the same color such as a white-light per pixel, or in a different color such as red, green, or blue per pixel.

The encapsulation layer 130 may be disposed in the display substrate 110 to cover the pixel array unit 120. The encapsulation layer 130 may prevent oxygen, moisture or other foreign material from penetrating into a light emitting elements layer of the pixel array unit 120. The encapsulation layer 130 may be formed in a stacked-layer structure where an organic material layer and an inorganic material layer are stacked alternately, but is not limited thereto.

The front part (FP) of the display panel 100 includes the display substrate 110, the pixel array unit 120 and the encapsulation layer 130, and may be formed to be flat except its edges. The first plate 210 may be connected or coupled with the front part (FP), in order to maintain the flat state and improve rigidity.

The bending part (BND) of the display panel 100 is a part where a user can easily bend the part in an intended direction and may be formed by including the wiring of signals and the display substrate 110 in which the pixel array unit 120, the encapsulation layer 130 and the first plate 210 are not disposed.

The pad part (PAD) of the display panel 100 may be an area where the pixel array unit 120 and the encapsulation layer 130 are not disposed. The pad part (PAD) may be connected or coupled with the second plate 220 so as to maintain the flat state and improve rigidity.

In other words, based on a form before the display panel 100 gets bent, the first plate 210 disposed at a lower portion of the front part (FP) of the display panel 100 and the second plate 220 disposed at a lower portion of the pad part (PAD) may be coupled at a lower portion of the display substrate 110 so as to reinforce rigidity of the display substrate 110 and maintain the flat state of the front part (FP).

The first plate 210 and the second plate 220 may be formed to have a certain rigidity and thickness so as to reinforce rigidity of the display substrate 110, and may not be formed in a bending part (BND) area where the bending part (BND) is positioned.

Based on the form before the display panel 100 gets bent, the first plate 210 and the second plate 220 may be disposed below the display substrate 110, and may be spaced apart from each other.

Based on a form after the display panel 100 gets bent, the first plate 210 is disposed below the front part (FP) and the second plate 220 is disposed at an upper portion of the pad part (PAD).

The first plate 210 and the second plate 220 may be backplates which are configured to be disposed at a rear surface of the display substrate 110. The first plate 210 and the second plate 220 may be formed of a thin film plastic having rigidity. For example, the first plate 210 and the second plate 220 may be formed of polyethyleneterephthalate (PET), polyimide (PI), polyethylene naphthalate (PEN) and the like, and are not limited thereto. The first plate 210 and the second plate 220 may be formed of the same material having the same thickness, but are not limited thereto.

Based on the form after the display panel 100 gets bent, between the first plate 210 and the second plate 220, the cushion plate 300 may be disposed. The cushion plate 300 may be formed of a plurality of layers or a single layer having features of cushioning and heat dissipation, and is not limited by its term.

The cushion plate 300 may include one or more layers among the heat dissipation layer 310, an anti-lifting layer 320, the cushion layer 330 and a first adhesive layer 340. For example, the cushion plate 300 may take a form where the first adhesive layer 340, the cushion layer 330, the anti-lifting layer 320 and the heat dissipation layer 310 are stacked from an upper portion to a lower portion (-Z direction).

The heat dissipation layer 310 may be disposed to correspond to a component generating high temperature, and may include a material having high thermal conductivity. Heat being generated in a driver 160 or the display panel 100 may be dissipated by the heat dissipation layer 310.

For example, the heat dissipation layer 310 may include a metal having high thermal conductivity such as copper (Cu) and aluminum (Al), or graphite but is not limited thereto. In addition, the heat dissipation layer 310 has conductivity and accordingly, may have a feature to be grounded and a feature to protect a rear surface of the display substrate 110 along with a feature of heat dissipation.

On the heat dissipation layer 310, the anti-lifting layer 320 may be disposed.

The anti-lifting layer 320 may be formed of a flexible material such as a polyimide film, but is not limited thereto.

The anti-lifting layer 320 may be disposed to prevent the cushion plate 300 from being lifted when sides of the cover member 20 get bent.

Thanks to flexibility, the anti-lifting layer 320 may minimize lifting that may occur when a curvature point is formed in the cover member 20.

The cushion layer 330 is disposed on the anti-lifting layer 320, and may include a material having a cushion such as a foam tape or a foam pad, and the like. The cushion layer 330 may absorb shocks given to various parts that may be in contact with the cushion plate 300.

The cushion layer 330 having the shock-absorbing feature may reinforce rigidity of the cushion plate 300.

The first adhesive layer 340 may be disposed on the cushion layer 330 and may include an uneven structure configured to be formed on a surface of the first adhesive layer 340. Since the uneven structure of the first adhesive layer 340 may prevent occurrence of air bubbles between the first plate 210 and the cushion plate 300 that may arise when the cushion plate 300 is attached to the first plate 210, a process to remove the air bubbles existing between the first plate 210 and the cushion plate 300 may be omitted.

The first adhesive layer 340 includes an adhesive substance, and may fix the cushion plate 300 to the first plate 210 by being in direct contact with the first plate 210.

Below the cushion plate 300, a second connecting member 400 and a second plate 220 may be disposed.

The second connecting member 400 may be disposed between the cushion plate 300 and the pad part (PAD), or between the cushion plate 300 and the second plate 220. The second connecting member 400 may serve to fix the bent display panel 100 so as to maintain a bent form. The second connecting member 400 may be formed to have a certain thickness in a thickness direction so that a curvature of the bending part (BND) can be maintained constantly. The second connecting member 400 may be a double-sided adhesive tape that can fix the second plate 220 and the heat dissipation layer 310 of the cushion plate 300, but is not limited thereto. In order to further improve a feature of absorbing shocks, the second connecting member 400 may be formed of an adhesive foam tape or an adhesive foam pad.

Below the second connecting member 400, the second plate 220 may be disposed. In order to dispose and fix the second plate 220 below the second connecting member 400, the second plate 220 may be connected or attached at a lower portion of the pad part (PAD) of the display panel 100, and the second plate 220 may be attached or fixed to a lower portion of the second connecting member 400 by bending the bending part (BND).

In a state in which the second plate 220 is fixed to the second connecting member 400, the second plate 220 may be disposed on the pad part (PAD). In other words, between the heat dissipation layer 310 of the cushion plate 300 and the pad part (PAD), the second connecting member 400 and the second plate 220 may be disposed.

With the second plate 220 fixed to the second connecting member 400, an exterior which is a top surface of the bending part (BND) is exposed to the outside, and a rear surface of the bending part (BND) which is an inner surface may be disposed to face with a side of the cushion plate 300 and a side of the second connecting member 400.

On the top surface which is the exterior of the bending part (BND) of the display panel 100, a first reinforcing member 600 may be disposed. The first reinforcing member 600 covers the bending part (BND) and may extend to cover the front part (FP) and at least some portion of the pad part (PAD).

The first reinforcing member 600 may include resin. For example, the first reinforcing member 600 may include ultraviolet (UV) curable acryl resin, or thermoset resin, and various materials may be used as the first reinforcing member 600 and is not limited thereto.

The first reinforcing member 600 may be formed of a cured product of resin that went through a curing process after applying resin. If using UV curable resin, curing may be achieved through UV light irradiation. If using thermoset resin, resin is hardened by heating. The first reinforcing member 600 may be a Micro Cover Layer (MCL).

The first reinforcing member 600 may cover various wirings of signals arranged between the pad part (PAD) and the encapsulation layer 130 of the display panel 100, thereby preventing the wirings of signals from penetration of moisture while protecting the wirings of signals from external shocks.

In the bending part (BND), since some components except the display substrate 110 and the wirings of signals may be omitted in order to improve flexibility of the display panel 100, rigidity may be degraded. The first reinforcing member 600 may reinforce degraded rigidity of the bending part (BND) caused by the omission of some components.

The bending part (BND) is a part disposed between the front part (FP) and the pad part (PAD), and may be bent so that the front part (FP) and the pad part (PAD) can be connected with each other and that the pad part (PAD) can be disposed below the front part (FP). The larger the degree of bending of the bending part (BND) gets, the bigger the compressive force and tensile force given to the wirings of signals disposed in the bending part (BND) gets. If the bending part is deformed by external shocks, the bending part which includes the wirings of signals and the display substrate 110 may have cracks or be broken.

In other words, if folding or bending the bending part (BND) sharply, the wirings of signals disposed in the bending part (BND) may be damaged, therefore, the bending part (BND) may be bent with a certain curvature. The curvature of the bending part (BND) may be represented by a radius of curvature (R1), and the larger the radius of curvature (R1) gets, the larger the bending part (BND) gets, and the smaller the radius of curvature (R1) gets, the smaller the bending part (BND) gets. The larger the radius of curvature of the bending part (BND) gets, the bigger the non-active area gets, and the smaller the radius of curvature (R1) gets, the narrower the non-active area of the bending part (BND) gets.

If the bending part is folded or bent in a shape with a high inclination angle and fixing it to stay in such a state in order to reduce the non-active area of the bending part (BND), rather than curving it to have a circular shape with a certain radius of curvature, folding occurs at the point where the front part (FP) is connected to the bending part (BND) or at the point where the bending part (BND) is connected to the pad part (PAD), and that results in cracks or damage in the wiring of signals.

Therefore, in order to prevent breakage in the display panel 100 or the wirings of signals, the bending part (BND) may be formed to be bent to have a certain radius of curvature depending on a distance between the front part (FP) and the pad part (PAD).

For example, the bending part (BND) may be configured to be bent by forming a radius of curvature (R1) at a half-length of the distance or the thickness (T) between the front part (FP) and the pad part (PAD).

When the radius of curvature (R1) of the bending part (BND) is formed to be equal to or more than a half-length of the distance or thickness (T) between the front part (FP) and the pad part (PAD), the bending part (BND) may be positioned in a location bent upwards more than the front part (FP), or positioned in a location bent downwards more than the pard part (PAD), and the interference with other parts may occur. Also, the non-active area of the bending part (BND) may increase.

When forming the radius of curvature (R1) of the bending part (BND) at the half-length of the thickness (T) or the distance between the front part (FP) and the pad part (PAD), since the radius of curvature (R1) and the non-active area of the bending part (BND) may be determined by the distance between the front part (FP) and the pad part (PAD), it becomes difficult to reduce the non-active area.

Figure 3:
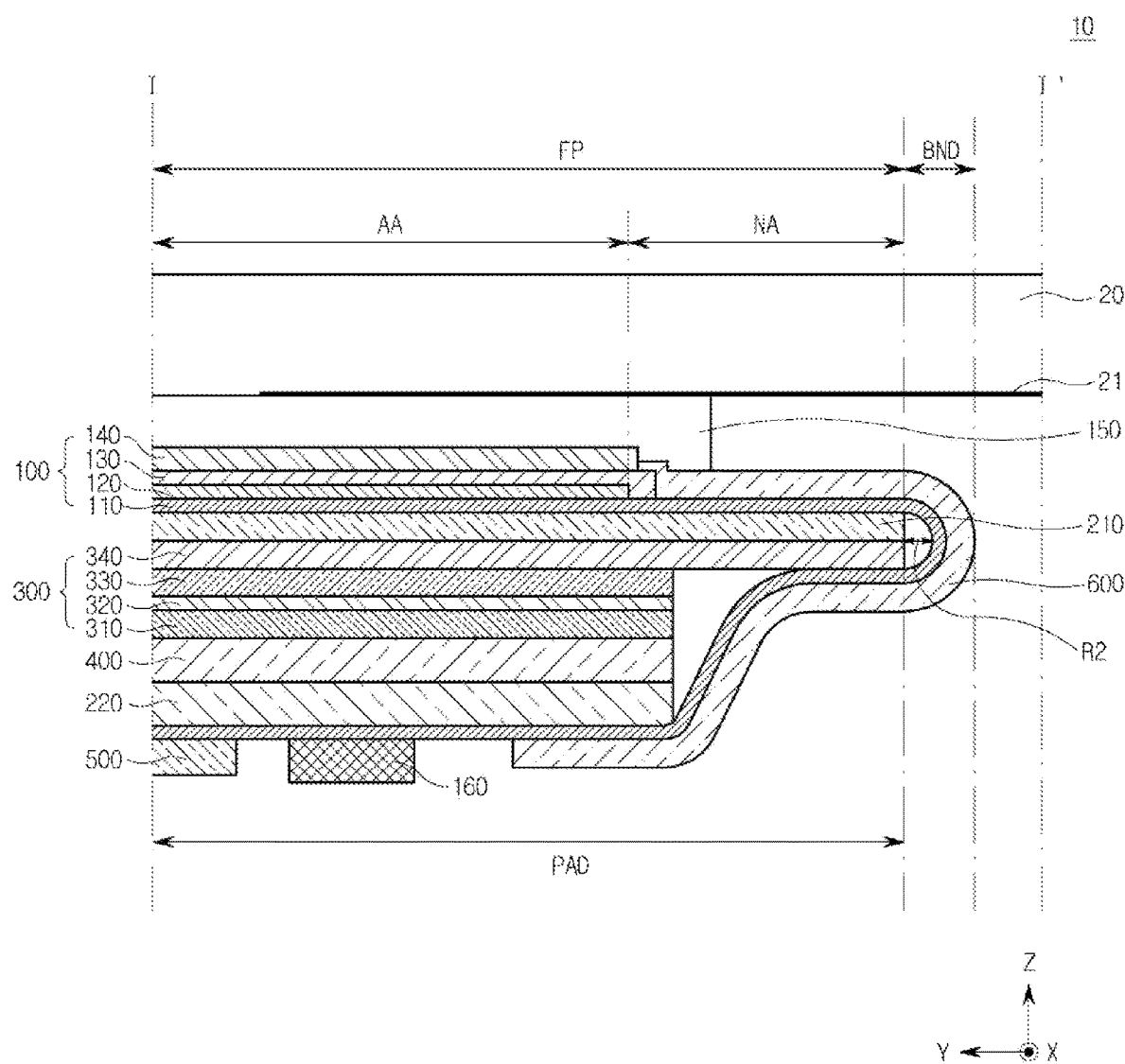
FIG. 3 is a cross-sectional view of a display device according to an aspect of the present disclosure.

FIG. 3 is a cross-sectional view of a display device according to an aspect of the present disclosure.

Referring to FIG. 3, the display device 10 is an aspect capable of reducing the radius of curvature (R2) of the bending part (BND) and capable of reducing the non-active area without adding or deleting components.

The display device 10 may include a cover member 20 and a display panel 100 attached in a downward direction (−Z axis) which is below the cover member 20. The display device 10 may include a first plate 210, a cushion plate 300, a second connecting member 400, and a second plate 220 disposed below the front part (FP) of the display panel 100.

The cushion plate 300 may include at least one or more layers among a heat dissipation layer 310, an anti-lifting layer 320, a cushion layer 330, and a first adhesive layer 340. For example, the cushion plate 300 may have a form in which the first adhesive layer 340, the cushion layer 330, and the heat dissipation layer 310 are stacked from an upper portion to a lower portion (−Z axis).

The first plate 210 and the first adhesive layer 340 may be formed to protrude further towards a bending part area where the bending part is positioned or towards a side of the bending part than the cushion layer 330, the heat dissipation layer 310 and the second plate 220. Or, the cushion layer 330, the heat dissipation layer 310, and the second plate 220 may be formed by retracting in a direction opposite to the bending part area or a side of the bending part than the first plate 210 and the first adhesive layer 340.

When the first plate 210 and the first adhesive layer 340 are formed to protrude further, the cushion plate 300 may have a stepped portion, and as it gets closer towards the bending part area or a side of the bending part, the thickness or distance between the pad part (PAD) and the front part (FP) gets shorter.

If the first plate 210 and the first adhesive layer 340 are formed to protrude further, a portion of the pad part (PAD) of the display panel 100 may be connected with or contact with the first adhesive layer 340, and another portion of the pad part (PAD) may be disposed below the second plate 220. The pad part (PAD) may have a portion extending in a diagonal direction so that a portion of the pad part (PAD) disposed below the first adhesive layer 340 and another portion of the pad part (PAD) disposed below the second plate 220 can be connected with each other. Since the pad part (PAD) may be folded by a portion extending in the diagonal direction of the pad part (PAD), by forming the first plate 210 and the first adhesive layer 340 to protrude larger than the cushion layer 330 or the second plate 220, the angle of a portion extending in the diagonal direction can decrease, and the occurrence of folding can be reduced.

The bending part (BND) of the display panel 100 may be supported by the top surface of the first plate 210 and the bottom surface of the first adhesive layer 340 and then can be bent, and the radius of curvature (R2) of the bending part (BND) may be formed to a half-length of the thickness of the first plate 210 and the first adhesive layer 340.

The radius of curvature (R2) of the bending part (BND) according to the aspect of the present disclosure is the half-length of the thickness of the first plate 210 and the first adhesive layer 340, and the radius of curvature (R1) of the bending part (BND) according to the aspect of FIG. 2 is the half-length of the thickness of the first plate 210, the cushion plate 300, the second connecting member 400, and the second plate 220. Thus, the radius of curvature (R2) according to the aspect of the present disclosure is smaller than the radius of curvature (R1) according to the aspect of FIG. 2. Therefore, according to the decreased radius of curvature of the bending part (BND), the non-active area may also decrease.

When steps are formed on the cushion plate 300 to reduce the non-active area of the bending part (BND), a portion of the pad part (PAD) of the display panel 100 contacts with or is fixed to the first adhesive layer 340, and another portion of the pad part (PAD) may be disposed below the second plate 220. An adhesive or tape for fixing may be disposed between the second plate 220 and another portion of the pad part (PAD). Fixing of the pad part (PAD) may be implemented in various methods, and is not limited to a specific method.

The smaller the radius of curvature of the bending part (BND) gets, the higher the tensile force and compressive force applied to the bending part (BND) gets. Therefore, it is necessary to adjust the radius of curvature of the bending part (BND) considering the size of the non-active area of the bending part and the force applied to the bending part (BND). Regarding adjustment of the radius of curvature, it is possible to increase the radius of curvature by adjusting a step formed on the cushion plate 300.

Since the cushion plate 300 may be formed by stacking a plurality of layers, by retracting some layers of the plurality of layers in the opposite direction to the bending part area or a side of the bending part (BND), the thickness of the step can be changed and the radius of the curvature of the bending part (BND) can be changed.

For example, when retracting the anti-lifting layer 320 and heat dissipation layer 310 of the cushion plate 300 in the opposite direction to the bending part area or a side of the bending part (BND), the radius of curvature of the bending part (BND) is formed at the half-length of the thickness of the first plate 210, the first adhesive layer 340, and the cushion layer 330, therefore the radius of curvature becomes larger than that of the aspect of FIG. 3, and the tensile force and compressive force applied to the bending part (BND) may be reduced.

The second connecting member 400 and the second plate 220 disposed below the cushion plate 300 also retract along with the anti-lifting layer 320 and the heat dissipation layer 310 in the opposite direction to the bending part area or a side of the bending part (BND), therefore, the angle of the part extending in the diagonal direction of the pad part (PAD) becomes small, and the occurrence of folding of the pad part (PAD) can also be reduced.

In order to make the radius of curvature of the bending part (BND) larger, the second connecting member 400 or the second plate 220 may retract in the opposite direction to the bending part area or a side of the bending part (BND) without forming a step on the cushion plate 300.

Figure 4A:
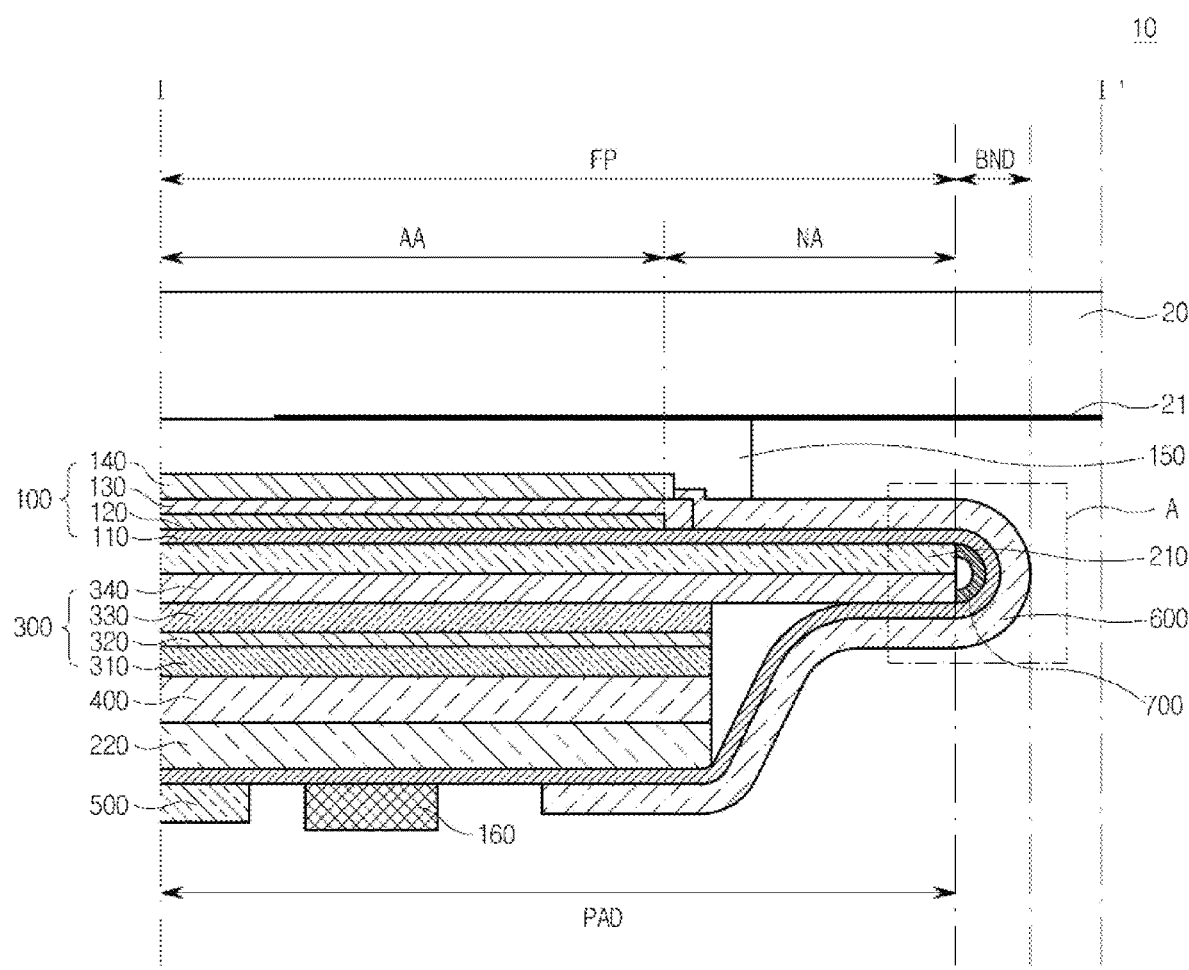
FIG. 4A is a cross-sectional view of reinforcing members disposed according to an aspect of the present disclosure.

FIG. 4A is a cross-sectional view of an aspect with reinforcing members disposed according to the present disclosure.

Referring to FIG. 4A, a higher tensile force is applied to the outer surface of the bending part (BND) having a radius of curvature reduced than before, and a higher compressive force is applied to the inner surface of the bending part (BND) compared to the previous compressive force. When deformation occurs in the bending part (BND) since external shocks are given to the bending part (BND) to which high compressive force and tensile forces are applied, cracks or breakage may occur in the display substrate 100 of the bending part (BND) and the wirings of signals. Therefore, the first reinforcing member 600 may be disposed on the top surface that is the outer surface of the bending part (BND).

In addition, the second reinforcing member 700 may be disposed on a bottom surface that is an inner portion of the bending part (BND). The second reinforcing member 700 covers the bending part (BND) and may extend to at least some portion of the pad part (PAD) and the front part (FP).

The second reinforcing member 700 may include resin. For example, the second reinforcing member 700 may include UV curable acryl resin, or thermoset resin, and is not limited thereto.

The second reinforcing member 700 may be formed of a cured product of resin that went through a curing process after applying soft resin. After curing, the resin is hardened and the bent shape of the bending part (BND) can be maintained, and the resin can protect the bending part from external shocks. Even when external shocks are given, the bent shape of the bending part (BND) does not change, and thus, damage in the display substrate 110 or the wirings of signals of the bending part (BND) can be prevented.

When UV curable acryl resin is used, UV rays are partially blocked by the first plate 210 disposed in an upper region of the display panel 100 and the second plate 220 disposed in a lower region of the display panel 100, making it difficult to sufficiently cure the resin. Therefore, after irradiating UV rays, moisture curing may be additionally performed to sufficiently harden the resin. Moisture curing can be applied by exposing resin to an environment of 40% to 60% humidity and 20° to 26° temperature for 7 days.

That is, when UV curable acryl resin is used as the second reinforcing member 700, UV curing and moisture curing can be performed in parallel to sufficiently harden and form a firmly hardened second reinforcing member 700.

The first reinforcing part 600 may be formed by applying and curing the resin in a state where the bending part (BND) is realized after the display panel 100 is bent, but in case of the second reinforcing member 700, since it is located inside the display panel 100, applying and curing the resin may be difficult in the state where the bending part (BND) is realized after the display panel 100 is bent.

To form the second reinforcing member 700, a method of applying the resin before bending the display panel 100 to form the bending part (BND), and then curing the resin after bending the display panel 100 may be used.

Before curing, the resin should maintain a soft state to make bending of the display panel 100 possible, and after curing, the resin should maintain a hardened state to maintain the bent shape of the bending part (BND), thereby preventing the external shocks.

The resin in a soft state before curing has flowability, so if you apply resin to the bending part (BND) and bend the display panel 100, it may flow down. Therefore, it is possible to prevent the resin from flowing down by additionally installing a dam at the end of the area to apply the resin. The first plate 210 or the second plate 220 disposed on the front part (FP) and the pad part (PAD) may serve as a dam. That is, when the resin is applied to the display panel 100 between the first plate 210 and the second plate 220, the resin can be fixed without flowing by the first plate 210 and the second plate 220, and then, a second reinforcing member 700 having a certain thickness can be formed.

Figure 4B:
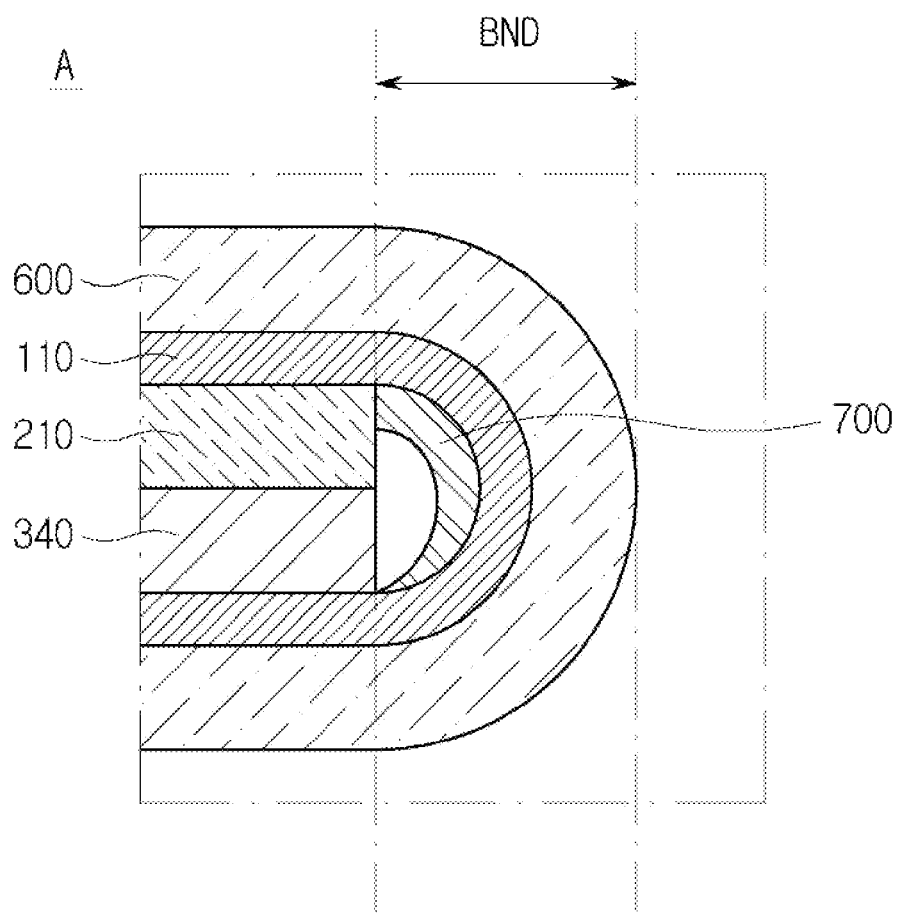
FIG. 4B is an enlarged cross-sectional view of area "A" of FIG. 4A illustrating reinforcing members according to another aspect of the present disclosure.

FIG. 4B is an enlarged cross-sectional view of the area "A" of FIG. 4A, illustrating another aspect of reinforcing members according to the present disclosure.

Referring to FIG. 4B, the second reinforcing member 700 has a structure formed to have a thickness that gets thinner from the top to the bottom. One end of the second reinforcing member 700 is in contact with the first plate 210, and the other end is not in contact with any component.

The resin for forming the second reinforcing member 700 has flowability before it is cured, thus a failure may occur if the resin penetrates into other components. Therefore, dams may be formed at one end and the other end of the resin so that the resin before curing cannot penetrate into other components. Or, since the resin can be prevented from flowing by the first plate 210 that serves as a dam in the area where the first plate 210 is disposed as shown in FIG. 4B, the thickness of the resin can increase. While the other end has no configuration that blocks the flow of the resin, the resin may be formed thinner so as to reduce the flowability and to prevent penetration of the resin into other components.

Depending on the purpose and effect, the second reinforcing member 700 may be formed to have a thickness that varies by location from the first plate 210 to the first adhesive layer 340.

Figure 4C:
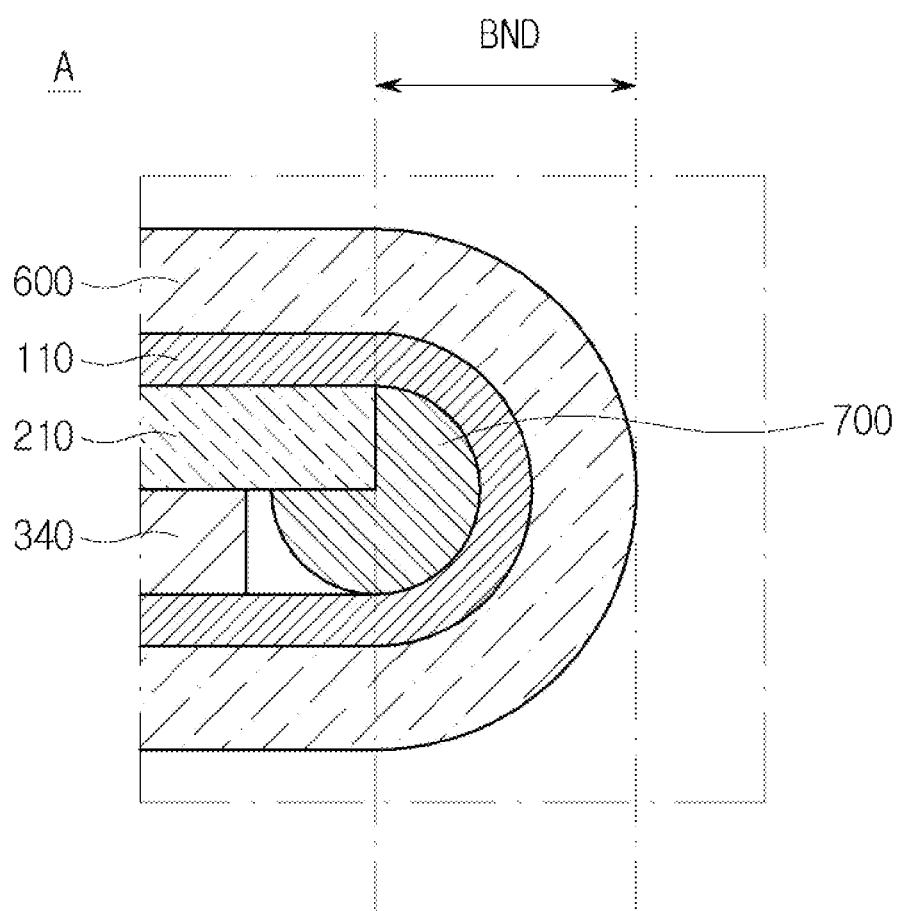
FIG. 4C is an enlarged cross-sectional view of area "A" of FIG. 4A illustrating another aspect of reinforcing members according to the present disclosure.

FIG. 4C is an enlarged cross-sectional view of the area "A" of FIG. 4A, illustrating another aspect of reinforcing members according to the present disclosure.

Referring to FIG. 4C, the second reinforcing member 700 may be formed to fill a space between the bending part (BND), the first plate 210 and the first adhesive layer 340. The second reinforcing member 700 may reinforce rigidity of the bending part (BND) if it is applied more to the bending part (BND). Thus, rigidity of the bending part (BND) may be increased by sufficiently filling a space between the bending part (BND), the first plate 210 and the first adhesive layer 340 with resin and curing the filled resin.

The first adhesive layer 340 disposed below the first plate 210 may be formed to have a shorter length than the first plate 210 in order to increase the amount of resin to be applied to form the second reinforcing member 700, so that the end surface of the first plate 210 may be exposed. And, the resin forming the second reinforcing member 700 may be applied to cover the side of the end and some area of the lower portion of the first plate 210. That is, the second reinforcing member 700 may contact with at least a portion of the side and the lower portion of the first plate 210.

That is, the first plate 210 may be configured to protrude further toward a side of the bending part (BND) or the bending part area where the bending part (BND) is located than the first adhesive layer 340, and the second reinforcing member 700 may be configured to contact with at least some area of the side surface and the bottom surface of the first plate 210.

A method of forming the second reinforcing member 700 according to an aspect of the present disclosure is applying resin of high viscosity to the bending part (BND), forming the resin to stay without flowing through temporary curing, bending the bending part (BND), and forming the second reinforcing member 700 through actual curing. There are various methods of forming the second reinforcing member 700, and the methods are not limited to certain ones.

If the second reinforcing member 700 is formed, the second reinforcing member 700 can support an intaglio or a concave pattern in the display substrate 110 that is formed to facilitate bending of the bending part (BND). Thus, the first plate 210 to support a pattern formed in the display substrate 110 is not required, and the length of the first plate 210 positioned towards the bending part (BND) area can be reduced.

Figure 5:
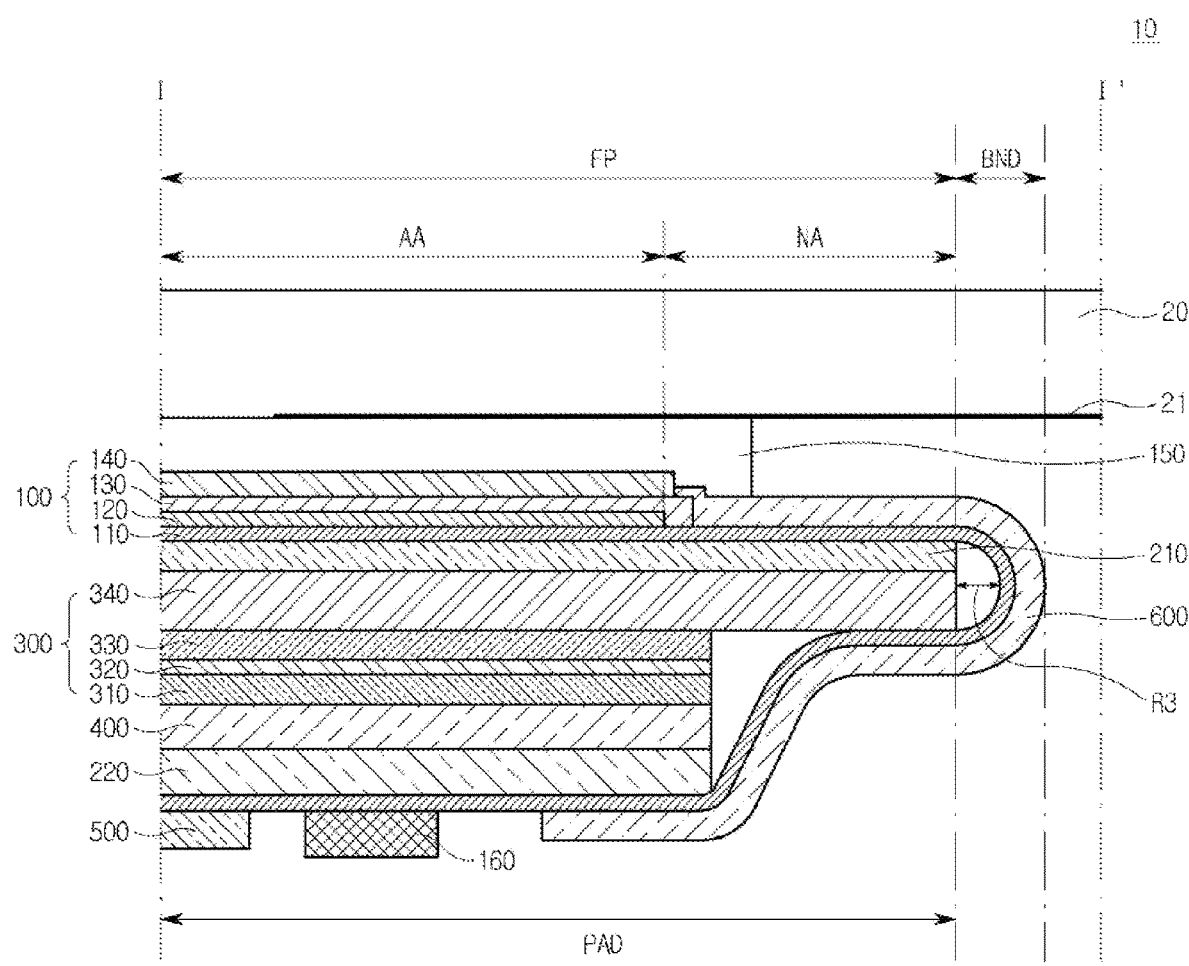
FIG. 5 is a cross-sectional view of a display device according to another aspect of the present disclosure.

FIG. 5 is a cross-sectional view of a display device according to another aspect of the present disclosure.

FIG. 5 shows an aspect of a radius of curvature adjusted due to increased compressive force and tensile force given to the bending part (BND) when a radius of curvature of the bending part (BND) is small.

It is possible to change a radius of curvature of the bending part (BND) by adjusting a distance between the front part (FP) and the pad part (PAD), and it is possible to change a distance between the front part (FP) and the pad part (PAD) by changing a thickness from the first plate 210, the cushion plate 300, the second connecting member 400 to the second plate 220 positioned between the front part (FP) and the pad part (PAD).

The aspect of FIG. 5 shows a case where a radius of curvature (R3) is formed larger by increasing a thickness of the first adhesive layer 340 of the cushion plate 300.

Figure 6:
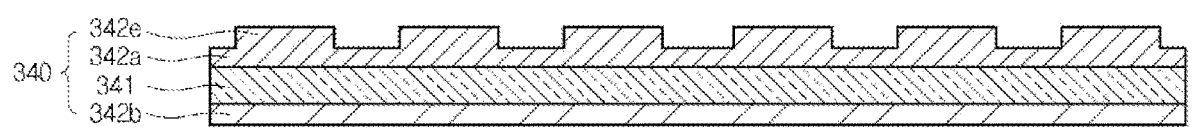
FIG. 6 is a cross-sectional view of a first adhesive layer according to the present disclosure.

FIG. 6 is a drawing that illustrates the first adhesive layer 340 according to the aspect of FIG. 5, and the first adhesive layer 340 may include a first base material 341, a first layer 342a and a second layer 342b each disposed on both opposite surfaces or sides of the first base material 341.

The first layer 342a of the first adhesive layer 340 may have an embossed layer 342e where a plurality of embosses are formed like an uneven structure. For example, the embossed layer 342e may be an embossing pattern or an embossing pattern layer and is not limited by terms.

At least one or more layers among the first layer 342a, the second layer 342b and the embossed layer 342e may be formed of a material having an adhesive substance. For example, all of the first layer 342a, the second layer 342b and the embossed layer 342e may be formed of a material having an adhesive substance.

The first layer 342a of the first adhesive layer 340 may be a surface that contacts with the first plate 210, and if the first layer 342a has the embossed layer 342e, a process to remove air bubbles may be omitted since the air bubbles that occur between the first plate 210 and the cushion plate 300 can be prevented.

The first base material 341 may serve to maintain the shape of the first adhesive layer 340, and may be formed of materials having a certain rigidity and hardness enough to maintain the shape of the first base material 341. For example, the first base material 341 may be formed of materials such as polyethylene terephthalate (PET) and the like, and is not limited thereto.

The first layer 342a and the second layer 342b are materials having an adhesive substance, and may be pressed down by an external force. Therefore, if increasing a thickness of the first layer 342a and the second layer 342b, the pressing may intensify and the first adhesive layer 340 may be deformed.

Therefore, it is possible to increase a thickness of the first base material 341 in order to increase a thickness of the first adhesive layer 340. By doing so, it is possible to increase a thickness of the first adhesive layer 340 without occurrence of the pressing.

The second layer 342b may contact with the cushion layer 330. For example, the second layer 342b may adhere the cushion layer 330 to the first adhesive layer 340 and fix them.

Since the first base material 341 of the first adhesive layer 340 may serve to maintain the shape of the cushion layer 330 as well as that of the first adhesive layer 340, a feature to maintain the shape of the cushion layer can improve.

In order to change a radius of the curvature of the bending part (BND), a component may be added between the front part (FP) and the pad part (PAD).

Figure 7:
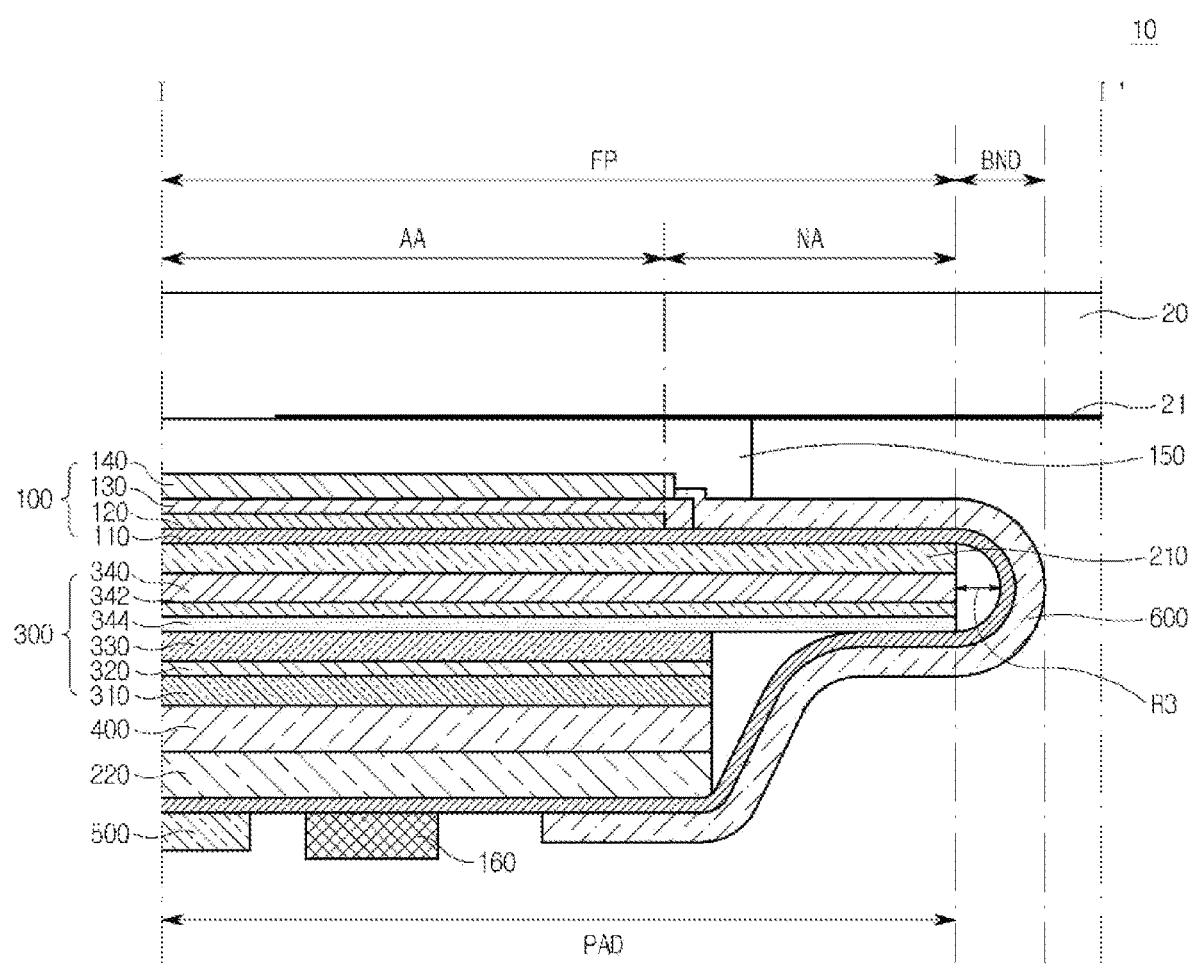
FIG. 7 is a cross-sectional view of a display device according to another aspect of the present disclosure.

FIG. 7 is a cross-sectional view of a display device according to another aspect of the present disclosure.

Referring to FIG. 7, by adding a second base material 342 and a second adhesive layer 344 between the front part (FP) and the pad part (PAD), a distance between the front part (FP) and the pad part (PAD) increases and the radius of curvature (R3) is formed to be large.

The second base material 342 and the second adhesive layer 344 may be formed in a structure similar to that of the first adhesive layer 340. The second base material 342 may be adhered or connected to a lower portion of the first adhesive layer 340. The second adhesive layer 344 is formed of a material having adhesive substance, the second adhesive layer 344 is disposed below the second base material 342, and the second adhesive layer 344 may adhere or connect the second base material 342 to the cushion layer 330.

The second base material 342 may serve to maintain the shape of the first adhesive layer 340 and the second adhesive layer 344, and may be formed of materials having a certain rigidity and hardness so that the shape of the second base material 342 can be maintained. For example, the second base material 342 may be formed of polyethylene terephthalate (PET) and the like, and is not limited thereto.

In case of a structure to which the second base material 342 and the second adhesive layer 344 are added, since a plurality of layers are stacked, rigidity may increase compared with a structure that increases only a thickness of the first adhesive layer 340.

Figure 8:
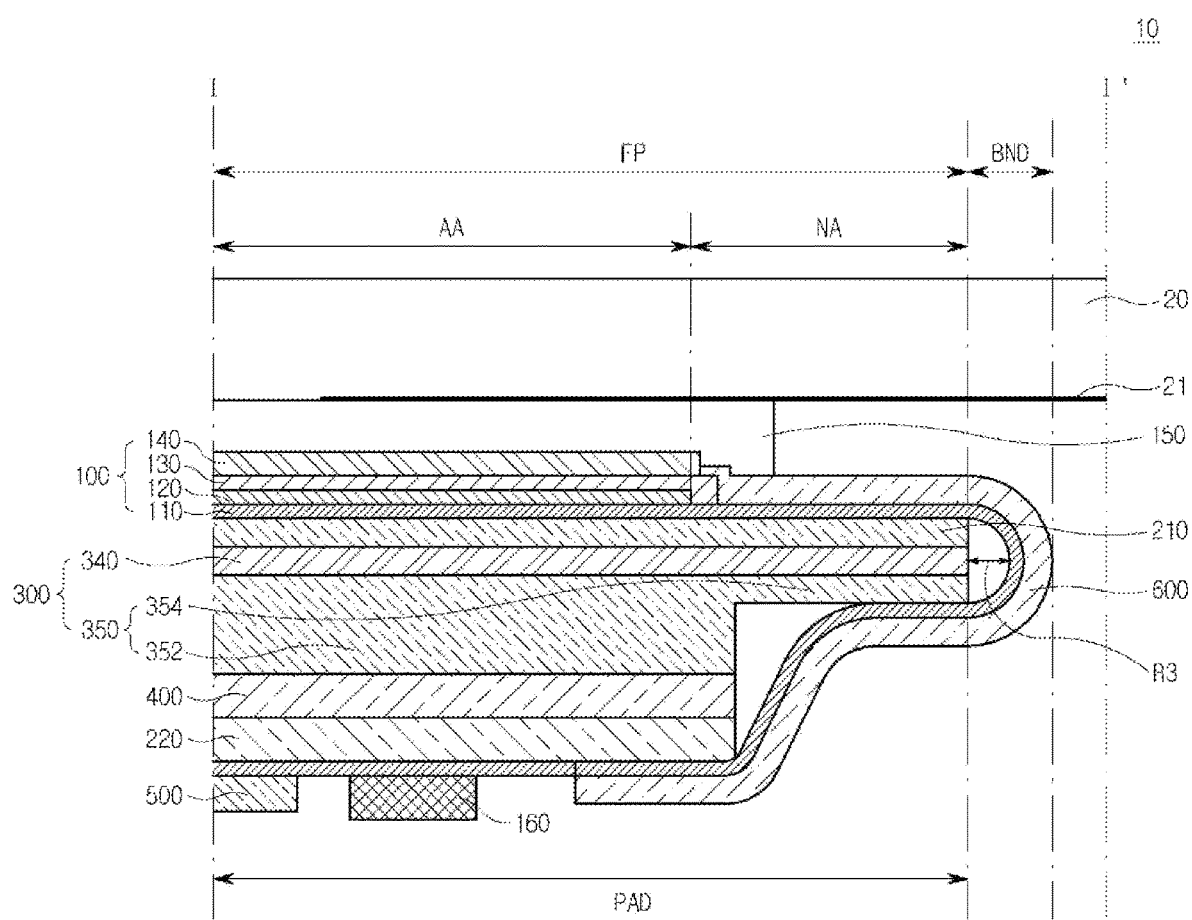
FIG. 8 is a cross-sectional view of a display device according to another aspect of the present disclosure.

FIG. 8 is a cross-sectional view of a display device according to another aspect of the present disclosure.

Referring to FIG. 8, the cushion plate 300 may include the first adhesive layer 340 and the porous substrate 350, and may include first plate 210, the first adhesive layer 340, the porous substrate 350 and the second plate 220 between the front part (FP) and the pad part (PAD) of the display panel 100.

The first adhesive layer 340 of a certain thickness may be stacked on a top surface of the porous substrate 350 and may be disposed to protrude further towards the bending part area or a side of the bending part (BND) than the second plate 220.

The first adhesive layer 340 includes an adhesive substance and may fix the porous substrate 350 to the first plate 210.

The porous substrate 350 may be a porous metal structure that includes a conductive metal and a plurality of pores arranged inside the conductive metal.

Since the conductive metal of the porous substrate 350 is formed of a metal having excellent heat conductivity, an excellent heat dissipation feature may be provided through the porous substrate 350. Since the porous substrate 350 has a shape of metal structure having a plurality of pores inside, a feature of excellent cushioning may be provided as well.

Moreover, since the porous substrate 350 is a conductive metal including a plurality of pores inside, the overall surface area may increase, and an excellent feature of heat dissipation may be provided through the porous substrate alone.

Therefore, only with the porous substrate 350, the cushion plate 300 according to an aspect of the present disclosure may have efficient features of heat dissipation and cushioning without requiring to form the heat dissipation layer for heat dissipation and the cushion layer for cushioning.

The porous substrate 350 may be manufactured by sintering metal foam precursor that includes metal powder, and the porous substrate 350 may be manufactured to have a shape as intended by changing a shape of a frame for production.

The porous substrate 350 according to an aspect of the present disclosure may include a second area 352 which is a lower portion of the porous substrate 350 and a first area 354 that protrudes further toward the bending part area or a side of the bending part (BND) than the second area 352 and may be formed to have a stepped portion.

In other words, the cushion plate 300 according to the aspect of the present disclosure is identical with the cushion plate according to another aspect in terms of the overall shape, but has difference in that the heat dissipation layer or the cushion layer and the like altogether are incorporated into the cushion plate 300.

The pad part (PAD) of the display panel 100 may be disposed below the porous substrate 350 along the steps, and a portion of the pad part (PAD) may be fixed to a portion of the first area 354 of the porous substrate 350, and another portion of the pad part (PAD) may be fixed to the lower portion of the second plate 220.

In order to fix the pad part (PAD), an adhesive or a tape may be disposed. Various methods may be used in fixing the pad part (PAD) to the cushion plate 300 or to the second plate 220 and such methods are not limited to what are mentioned above.

Due to steps formed in the porous substrate 350, the radius of curvature (R3) of the bending part (BND) may be made adjustable, and the non-active area of the bending part (BND) may be reduced.

Same as other aspects, the first reinforcing member 600 and the second reinforcing member 700 may be formed in the bending part (BND) and accordingly, rigidity of the bending part (BND) may be reinforced.

A display device according to the present disclosure may be explained as below.

A display device according to the present disclosure may comprise a display panel comprising a front part configured to display images, a bending part configured to extend from the front part and be bent and a pad part configured to extend from the bending part and be disposed below the front part; and a first plate, a cushion plate and a second plate configured to be disposed between the front part and the pad part, wherein the cushion plate comprises a first adhesive layer, a cushion layer, and a heat dissipation layer, and wherein a portion of the pad part is configured to contact with the first adhesive layer and another portion of the pad part is configured to be disposed below the second plate.

A display device according to the present disclosure may comprise a display panel comprising a front part configured to display images, a bending part configured to extend from the front part and be bent and a pad part configured to extend from the bending part and be disposed below the front part; and a first plate, a cushion plate and a second plate configured to be disposed between the front part and the pad part, wherein the cushion plate comprises a first adhesive layer, a cushion layer and a heat dissipation layer, wherein the first adhesive layer protrudes further towards the bending part area where the bending part is positioned than the cushion layer, the heat dissipation layer and the second plate, and wherein a distance between the pad part and the front part is configured to become shorter towards the bending part area.

The display device according to the present disclosure may further comprise a first reinforcing member configured to be disposed on an outer surface of the bending part; and a second reinforcing member configured to be disposed on an inner surface of the bending part; wherein the second reinforcing member has a uniform thickness.

The display device according to some aspects of the present disclosure may further comprise a first reinforcing member configured to be disposed on an outer surface of the bending part and a second reinforcing member configured to be disposed on an inner surface of the bending part, wherein a thickness of the second reinforcing member is configured to become thinner towards the lower portion.

The display device according to some aspects of the present disclosure may further comprise a first reinforcing member configured to be disposed on an outer surface of the bending part and a second reinforcing member configured to be disposed on an inner surface of the bending part, wherein a length of the first adhesive layer is shorter than a length of the first plate, and the second reinforcing member is configured to contact with at least some portion of a bottom surface and a side surface of the first plate.

According to some aspects of the present disclosure, the first adhesive layer may comprise a first base material, a second layer configured to be disposed below the first base material and a first layer configured to be disposed on the first base material, wherein a top surface of the first layer has an embossing pattern.

According to some aspects of the present disclosure, the display device may further comprise a third plate and a second adhesive layer configured to be disposed between the first adhesive layer and the cushion layer.

The display device according to some aspects of the present disclosure may comprise a display panel comprising a front part configured to display images, a bending part configured to extend from the front part and be bent and a pad part configured to extend from the bending part and be disposed below the front part; and a first adhesive layer, a porous substrate and a second plate configured to be disposed between the front part and the pad part, wherein the first adhesive layer may be configured to protrude further towards a bending part area where a bending part is positioned than the second plate and the porous substrate may comprise a second area configured to be disposed on the second plate and a stepped portion including a first area configured to protrude further towards the pad part area.

According to some aspects of the present disclosure, a portion of the pad part is configured to be fixed with a portion of a first area of the porous substrate; and another portion of the pad part is configured to be fixed below a second plate.

Described above are detailed description of aspects of the present disclosure with reference to the accompanying drawings. However, it would be understood that the present disclosure is not limited by the aspects described herein and may be implemented in many different forms without departing from the technical concept thereof. Thus, the aspects set forth hereinabove are examples to explain the technical concept, and do not limit the scope of the technical concept of the present disclosure. Therefore, it should be understood that the aspects set forth hereinabove are exemplary and are not limitative. The protective scope of the present disclosure should be construed based on the following claims, and all the technical concepts in the equivalent scope of the claims should be construed as falling within the scope of the present disclosure.

What is claimed is:
1. A display device comprising:
a display panel comprising a front part configured to display images, a bending part extended to bend from the front part and a pad part extended from the bending part and disposed below the front part; and
a first plate, a cushion plate and a second plate disposed between the front part and the pad part,
wherein the cushion plate comprises a first adhesive layer, a cushion layer, and a heat dissipation layer, wherein a portion of the pad part is configured to contact with the first adhesive layer and another portion of the pad part is configured to be disposed below the second plate, and wherein a step difference is formed between the portion of the pad part configured to contact with the first adhesive layer and another portion of the pad part configured to be disposed below the second plate.

2. The display device of claim 1, further comprising:
a first reinforcing member disposed on an outer surface of the bending part; and
a second reinforcing member disposed on an inner surface of the bending part,
wherein the second reinforcing member has a uniform thickness.

3. The display device of claim 1, further comprising:
a first reinforcing member configured to be disposed on an outer surface of the bending part; and
a second reinforcing member configured to be disposed on an inner surface of the bending part,
wherein a thickness of the second reinforcing member is configured to vary by location from a first plate to a first adhesive layer.

4. The display device of claim 1, further comprising:
a first reinforcing member disposed on an outer surface of the bending part; and
a second reinforcing member disposed on an inner surface of the bending part,
wherein a length of the first adhesive layer is shorter than a length of the first plate, and
wherein the second reinforcing member is in contact with at least some portion of a bottom surface and a side surface of the first plate.

5. The display device of claim 1, wherein the first adhesive layer comprises:
a first base material;
a second layer disposed below the first base material; and
a first layer disposed on the first base material and having an embossing pattern on a top surface.

6. The display device of claim 1, further comprising a third plate and a second adhesive layer disposed between the first adhesive layer and the cushion layer.

7. A display device comprising:
a display panel comprising a front part configured to display images, a bending part extended to bend from the front part and a pad part extended from the bending part and disposed below the front part; and
a first plate, a cushion plate and a second plate disposed between the front part and the pad part,
wherein the cushion plate comprises a first adhesive layer, a cushion layer and a heat dissipation layer;
wherein the first adhesive layer protrudes further towards a side of the bending part than the cushion layer, the heat dissipation layer and the second plate, and
wherein a distance between the pad part and the front part becomes shorter towards a side of the bending part.

8. The display device of claim 7, further comprising:
a first reinforcing member disposed on an outer surface of the bending part; and
a second reinforcing member disposed on an inner surface of the bending part,
wherein the second reinforcing member has a uniform thickness.

9. The display device of claim 7, further comprising:
a first reinforcing member disposed on an outer surface of the bending part; and
a second reinforcing member disposed on an inner surface of the bending part,
wherein a thickness of the second reinforcing member varies by location from a first plate to a first adhesive layer.

10. The display device of claim 7, further comprising:
a first reinforcing member disposed on an outer surface of the bending part; and
a second reinforcing member disposed on an inner surface of the bending part,
wherein a length of the first adhesive layer is shorter than a length of the first plate, and
wherein the second reinforcing member is in contact with at least some portion of a bottom surface and a side surface of the first plate.

11. The display device of claim 7, wherein the first adhesive layer comprises:
a first base material;
a second layer disposed below the first base material; and
a first layer disposed on the first base material and having an embossing pattern on a top surface.

12. The display device of claim 7, further comprising a third plate and a second adhesive layer configured to be disposed between the first adhesive layer and the cushion layer.

13. A display device comprising:
a display panel comprising a front part configured to display images, a bending part extended to bend from the front part and a pad part extended from the bending part and disposed below the front part; and
a first adhesive layer and a porous substrate disposed between the front part and the pad part,
wherein the porous substrate comprises a first area disposed at an upper portion of the pad part and a second area disposed in the first area and protrudes further towards a side of the bending part than a first area.

14. The display device of claim 13, wherein a portion of the pad part is connected with a portion of a second area of the porous substrate, and
wherein another portion of the pad part is connected below a first area of the porous substrate.

* * * * *